United States Patent
Manohar et al.

(10) Patent No.: US 11,575,372 B2
(45) Date of Patent: Feb. 7, 2023

(54) HIGH VOLTAGE GATE DRIVER CURRENT SOURCE

(71) Applicant: TEXAS INSTRUMENTS INCORPORATED, Dallas, TX (US)

(72) Inventors: Sujan Kundapur Manohar, Dallas, TX (US); Michael James Mills, Plano, TX (US); Justin Patrick Vogt, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/877,128

(22) Filed: May 18, 2020

(65) Prior Publication Data
US 2020/0280309 A1  Sep. 3, 2020

Related U.S. Application Data

(63) Continuation of application No. 15/802,787, filed on Nov. 3, 2017, now Pat. No. 10,659,033.

(51) Int. Cl.
*H03K 17/14* (2006.01)
*H03K 17/06* (2006.01)
(Continued)

(52) U.S. Cl.
CPC ........... *H03K 17/145* (2013.01); *G05F 3/245* (2013.01); *G05F 3/247* (2013.01);
(Continued)

(58) Field of Classification Search
CPC ................ G05F 3/247; G06F 13/4068; H03K 17/08104; H03K 17/08122; H03K 17/162; H03K 17/165
See application file for complete search history.

(56) References Cited

U.S. PATENT DOCUMENTS 6,150,800 A   11/2000  Kinoshita et al.
8,184,488 B2 *  5/2012  May .................... G11C 29/46
                                                      365/189.11
(Continued)

FOREIGN PATENT DOCUMENTS

JP   2015073366 A   4/2015

OTHER PUBLICATIONS

International Search Report for PCT/US2018/058832 dated Feb. 21, 2019.
European Search Report dated Mar. 31, 2021.

*Primary Examiner* — Ryan Johnson
*Assistant Examiner* — Colleen J O Toole
(74) *Attorney, Agent, or Firm* — Valerie M. Davis; Frank D. Cimino

(57) ABSTRACT

A power supply system for USB Power Delivery includes a current source drive circuit to control a power FET to regulate the supply of power along a power path. The current source drive circuit includes a cascode current source and a cascode protection circuit formed by a source follower and a feedback voltage divider. The source follower can be a transistor with its gate connected to a cascode node between upper- and lower-stage transistors of the cascode current source. The divider node of the voltage divider is connected to the gate of the lower-stage transistor. The current source drive circuit can operate within the gate-source voltage specifications of 30-volt DEPMOS devices, and can provide high output impedance to the gate of power FET and a current limit circuit during current limiting operation, without requiring an extra high-voltage mask during fabrication.

21 Claims, 5 Drawing Sheets

(51) Int. Cl.
*G05F 3/24* (2006.01)
*H03K 17/687* (2006.01)
*H03K 17/30* (2006.01)
*G06F 13/42* (2006.01)

(52) U.S. Cl.
CPC ....... *G06F 13/4282* (2013.01); *H03K 17/063* (2013.01); *H03K 17/6871* (2013.01); *H03K 2017/307* (2013.01); *H03K 2217/0036* (2013.01); *H03K 2217/0081* (2013.01)

(56) References Cited

U.S. PATENT DOCUMENTS

| | | | |
|---|---|---|---|
| 9,246,379 | B1 | 1/2016 | Chui et al. |
| 9,985,526 | B1* | 5/2018 | Oak .................. H02M 3/33507 |
| 2003/0098738 | A1* | 5/2003 | Descombes ............. G05F 3/262 |
| | | | 327/538 |
| 2013/0214823 | A1 | 8/2013 | Kawamoto et al. |
| 2017/0047731 | A1 | 2/2017 | Manohar |
| 2017/0317583 | A1 | 11/2017 | Forghani-Zadeh |
| 2018/0145673 | A1* | 5/2018 | Bogner ............ H03K 17/08104 |

* cited by examiner

HIGH VOLTAGE GATE DRIVER CURRENT SOURCE

CROSS-REFERENCE TO RELATED APPLICATIONS

This application is a continuation of U.S. patent application Ser. No. 15/802,787 filed Nov. 3, 2017, the entirety of which is incorporated herein by reference.

BACKGROUND

This relates generally to electronic circuits and methods, and more particularly to a high voltage gate driver current source.

USB Type-C is a Universal Serial Bus standard enabling reversible plug orientation and cable direction between a power source device (e.g., a mobile computer, such as a laptop computer or notebook computer) and a power sink device (e.g., a mobile phone). Under the standard, the power source device can dynamically manage current from 0.5 amperes to 3.0 amperes. USB Power Delivery (PD) is a single-wire protocol that uses the USB-C standard and cable. USB Type-C ports can function as either a power source, delivering power to a connected device (e.g., a mobile phone), or a current sink, transferring power from the connected device (e.g., a battery). PD negotiation allows devices to contract to deliver optimal power levels under current battery conditions. The protocol expands USB to deliver up to 100 watts of power (i.e., 20 volts at 5 amperes).

SUMMARY

In an example, a power supply system includes a current source drive circuit in a power FET controller to control the gate of a power FET to regulate the supply of power between a power input and the power output. The current source drive circuit includes a cascode current source having a cascode node between upper and lower stages, and a cascode protection circuit to sample the voltage at the cascode node and adaptively vary the voltage to the gate of the lower stage and to automatically configure the lower stage as a source follower and put the lower stage in saturation during an overcurrent condition requiring the limiting of current between the power input and the power output.

In another example, a method of supplying power includes supplying current with a cascode current source to a gate of a power FET to regulate power through a power path having an output. The method continues by detecting that current through the power path exceeds a predetermined current limit threshold. Based on this detecting, the gate of the power FET is pulled down, i.e., to a voltage lower than what the gate would experience during operation when the current through the power path does not exceed the predetermined current limit threshold. The method continues by biasing a lower stage of the cascode current source to operate in saturation, thereby increasing the output impedance of the cascode current source to the gate of the power FET and increasing the current accuracy of the cascode current source.

In yet another example, a circuit includes a power FET between high voltage power path and voltage bus nodes to regulate power transmission therebetween. A current source provides a biasing current to one side of a current mirror. A cascode current source comprises, on the other side of the current mirror, a upper stage and a lower stage. The source of the upper stage is connected to a charge pump voltage node and the drain of the lower stage is connected to the power FET gate. A feedback transistor has its gate at the middle node of the cascode (between the upper and lower stages) and its drain at the charge pump node. First and second feedback resistors are arranged as a voltage divider having an upper node, a divider node, and a lower node, the upper node connected to the source of the feedback transistor, the divider node connected to the gate of the lower stage of the cascode current source, and the lower node connected to the drain of the power FET.

DETAILED DESCRIPTION OF EXAMPLE EMBODIMENTS

A USB power path can consist of an internal/external back-to-back power FETs and a controller to control the gate of each power FET (i.e., to serve as a gate driver). This disclosure describes a high-voltage compliant current mirror made using lower voltage devices. The current mirror of the present disclosure can be used, for example, in a USB PD field-effect transistor (FET) controller, and has the advantage of reducing mask count and therefore reducing chip cost.

Cascode protection circuitry can protect a cascode current source in the high-voltage compliant current mirror from |VGS| violations during overcurrent conditions through the power path that cause current limit circuitry to pull down the gate of the power FETs. The cascode protection circuitry further allows the transistor devices in the cascode current source to be low-voltage devices, i.e., devices not rated for 40 volts VDS, saving fabrication costs incurred by the need for an extra high-voltage mask when making high-voltage devices.

The cascode protection circuitry can consist, for example, of source follower circuitry and feedback voltage divider circuitry arranged to sample the voltage at a cascode node in a cascode current source and adaptively vary the voltage at the gate of a lower stage of a cascode in cascode current source. The source follower circuitry can consist of, for example, a single feedback transistor, the gate of which is connected to the cascode node of the cascode current source, while the voltage divider circuitry can comprise two resistances arranged as a voltage divider between the source of the feedback transistor and the drain of the associated power FET. When the divider node of the voltage divider is connected to the gate of the lower stage of the cascode current source, the cascode protection circuitry can establish a feedback loop between the cascode node and the divider node to protect the cascode devices and enhance their operation as a cascode current source during current limiting operation. The result of this arrangement is the savings of an extra high-voltage mask and reduced fabrication costs.

Figure 1:
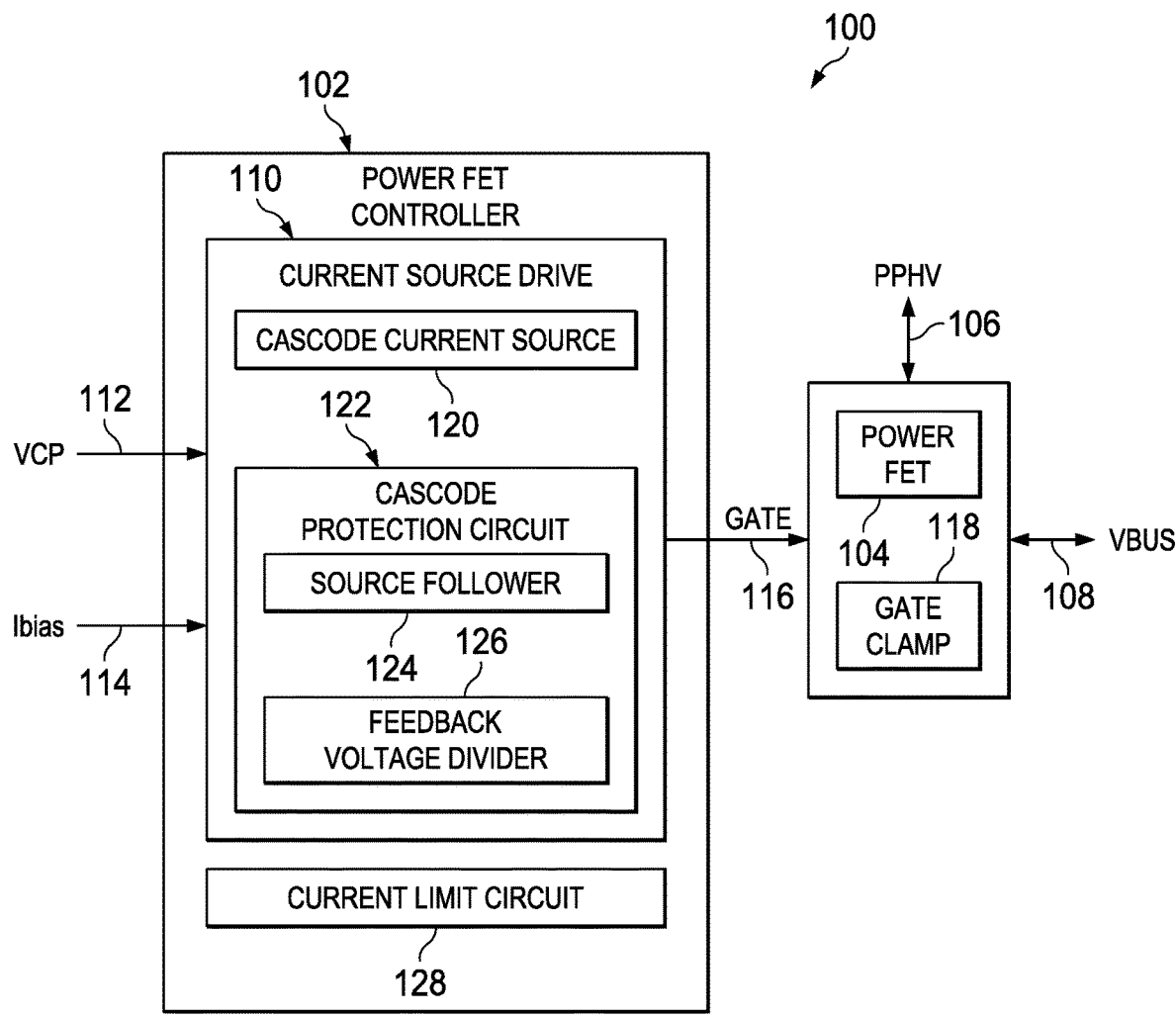
FIG. 1 is a system diagram of an example power supply system.

FIG. 1 is a system diagram illustrating a power supply system 100 that includes a power FET controller 102 to control power FET 104 to regulate the supply of power from a high voltage power path PPHV 106 to a voltage bus VBUS 108, or vice versa (as indicated by bidirectional arrows 106, 108), and to limit current along such path 106, 108. The power path 106 with voltage bus 108 can be used, for example, to supply power to, or source power from, peripheral devices over a USB connection, e.g., according to the USB PD protocol.

The power FET controller 102 includes a current source drive circuit 110 that functions according to a charge pump voltage VCP 112 and a biasing current 114 to regulate the current to a gate node 116 to which the gate of power FET 104 is attached. A gate clamp circuit 118 can be arranged to enforce a constant maximum gate-to-source voltage (VGS) for power FET 104. To regulate current to gate 116, current source drive 110 can include a cascode current source 120 that can supply a pull-up current ($I_{pu}$) to gate 116. Cascode current source 120 can, for example, be part of a larger cascode current mirror arrangement.

To protect devices in cascode current source 120 and ensure proper functioning of current source drive 110 during both normal and current-limiting modes of operation, a cascode protection circuit 122, which can include a source follower 124, and a feedback voltage divider 126, can sample the voltage at a cascode node in cascode current source 120 and adaptively vary the voltage at the gate of a lower stage of a cascode in cascode current source 120.

A current limit circuit 128 can compare power path current to a threshold to assist in limiting current through power FET 104, and thereby through power path 106, 108. Current limit circuit 128 can thereby respond to an overcurrent condition by pulling down gate 116 based on the comparison, e.g., by creating a pull-down current opposing a pull-up current ($I_{pu}$) supplied by cascode current source 120.

Cascode current source 120 can consist, for example, of transistor devices, e.g., low-power FETs (i.e., FETs with a gate-source voltage (VGS) reliability limit of less than 5 volts and drain-source voltage (VDS) reliability limit of less than 30 volts) arranged in a cascode configuration having an upper stage (with its source node connected to the charge pump voltage node 112) and a lower stage (with its source node connected to the drain node of the upper stage). Source follower 124 can consist, for example, of a feedback transistor arranged with its gate at a middle node in cascode current source 120 (i.e., the node connecting the drain of the upper stage of the cascode and the source of the lower stage of the cascode). Feedback voltage divider 126 can consist, for example, of feedback resistances arranged as a voltage divider having an upper node, a dividing node, and a lower node, with the upper node of voltage divider 126 connected to a source node of the feedback transistor, the dividing node of voltage divider 126 connected to a gate node of one of the transistors in the cascode, and the lower node of voltage divider 126 connected to a drain node of power FET 104, e.g., to a common drain node in an arrangement that may have power FET 104 placed drain-to-drain with a second power FET (not shown in FIG. 1).

Figure 2:
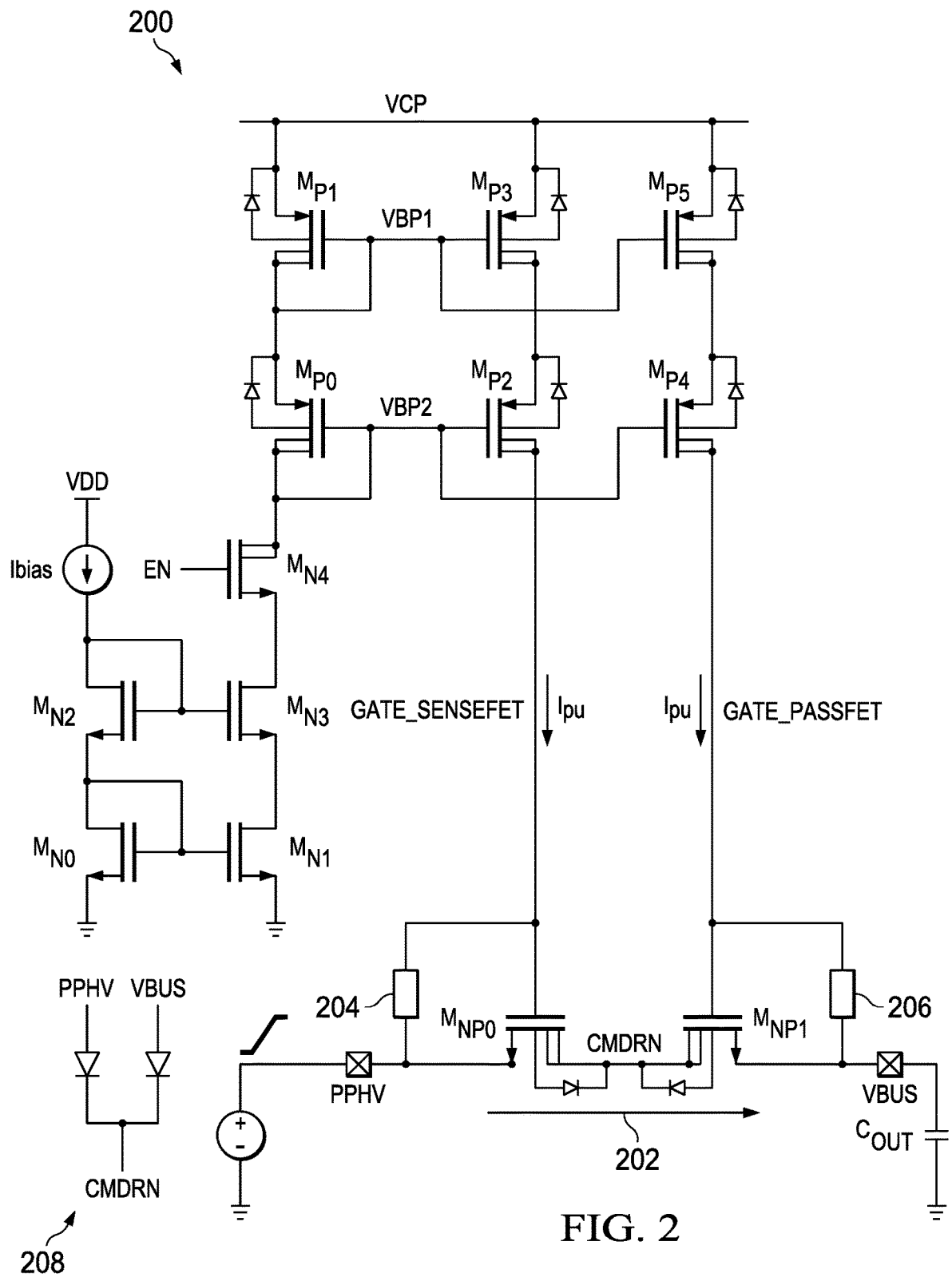
FIG. 2 is a circuit diagram of an example power supply circuit.

FIG. 2 is a circuit diagram of a power path circuit current source topology 200 that can be used, for example, for a USB PD application. Capacitor element $C_{OUT}$ represents the load presented by, for example, a peripheral device connected to bus at node VBUS, where the bus can be a USB power bus. As indicated by arrow 202, the power path circuit 200 can operate in source mode, i.e., to provide current flow from system-side high-voltage power path node PPHV to peripheral-side bus voltage node VBUS. Back-to-back power FETs $M_{NP0}$, $M_{NP1}$ provide port isolation. The drains of power FETs $M_{NP0}$, $M_{NP1}$ are connected at common drain node CMDRN, the voltage of which is the maximum of PPHV and VBUS (as indicated at 208).

Power FETs $M_{NP0}$, $M_{NP1}$ are each driven by a high-voltage gate drive circuit consisting of a cascode current source from charge pump VCP. In the illustrated circuit 200, transistors $M_2$, $M_{P3}$ together form the gate drive circuit for power FET $M_{NP0}$, while transistors $M_{P4}$, $M_{P5}$ together form the gate drive circuit for power FET $M_{NP1}$. Each cascode current source provides a pull-up current $I_{pu}$ to its respective power FET. Gate-to-source clamp circuits 204, 206 each maintain a constant maximum gate-source potential difference VGS for respective power FETs $M_{NP0}$, $M_{NP1}$ by taking in charging current $I_{pu}$ after the gate of respective power FET $M_{NP0}$ or $M_{NP1}$ is charged. Thus, in the case of power FET $M_{NP0}$, gate-source potential difference VGS is the difference between potentials at nodes GATE_SENSEFET and PPHV, while in the case of power FET $M_{NP1}$, gate-source potential difference VGS is the difference between potentials at nodes GATE_PASSFET and VBUS. Charge pump voltage node VCP has its input derived from common drain voltage CMDRN and an input supply (not shown), e.g., a 3.3-volt input supply VDD_3P3, as shown by the equation:

$$VCP = CMDRN(Max(PPHV, VBUS)) + n*3.3\ V$$

where n is the number of stages in the charge pump.

Charge pump voltage VCP must be sufficient to power all of (a) the power FETs, by supplying a sufficient gate-source potential difference VGS; (b) the drain-to-source voltage needed for the cascode current source(s); and (c) all other high-voltage circuits in the power path, as shown by the equation:

$$VCP = CMDRN(Max(PPHV, VBUS)) + VGS(M_{NP0}) + \\ VDS(M_{P2}) + VDS(M_{P3}) + \text{dropout of the charge pump due to loading}$$

or, similarly, $$VCP = CMDRN(Max(PPHV, VBUS)) + VGS(M_{NP1}) + \\ VDS(M_{P4}) + VDS(M_{P5}) + \text{dropout of the charge pump due to loading}$$

In example applications, e.g., where, by design, the target VGS of the power FET (e.g., $M_{NP1}$), as enforced by gate clamp (e.g., 206), is 10 volts or higher, the charge pump voltage VCP can be maintained at a potential of at least about 10.3 volts above common drain voltage CMDRN (i.e., the larger of PPHV or VBUS) after accommodation for loading. In such examples, the charge pump should be n=4 stages so that the charge pump voltage is always at least about 10.3 volts above CMDRN. It is also acceptable if VCP is one or two volts above this value.

Power FETs $M_{NP0}$, $M_{NP1}$ can be high-voltage MOSFETs, for example, NexFETs, which are low-cost vertical power FETs with very low drain-source on resistance $R_{DSon}$ to reduce power dissipation. NextFETs may have, for example, a maximum gate-to-source voltage (VGS) rating of 20 volts. In some examples, a multi-chip module (MCM) is used to co-package a NexFET die fabricated using the NexFET process and a controller die fabricated using a different process, e.g., a monolithic process, while in other examples, the separate NexFET component(s) and controller component(s) are separately assembled without having been packaged in an MCM. The maximum voltage on PPHV or VBUS is 24 volts for USB PD applications.

When the power FET gate-to-source voltage VGS (i.e., the target VGS enforced by gate clamp 206) is chosen as 10 volts, then the minimum charge pump voltage VCP needs to be greater than 34 volts to allow headroom for driver current source devices (e.g., $M_{P2}$, $M_{P3}$, $M_{P4}$, $M_{P5}$). In some examples, the charge pump voltage VCP can go up to a rail voltage, e.g. 36 volts or more. Therefore, as arranged in topology 200, driver current source devices (e.g., $M_{P2}$, $M_{P3}$, $M_{P4}$, $M_{P5}$) need to be rated for 40 volts VDS to accommodate potential large target VGS values (e.g., 10 to 20 volts). Devices not rated for 40 volts VDS may suffer damage or reduced performance when a potential difference of 40 volts or more is placed across the drain and source of any such device. 40-volt drain-extended PMOS (DEPMOS) devices constitute one example of devices that are rated for 40 volts VDS. However, 40-volt DEPMOS devices cost an extra high voltage (HV) mask, e.g., a double-diffused well (DWELL) mask or a P-buried layer (PBL) mask, in fabrication.

Thus, the current source topology shown in FIG. 2 has certain limitations when used to drive power FETs $M_{NP0}$, $M_{NP1}$ with VGS of 10 volts or greater, e.g., NexFETs. As examples, the FIG. 2 current source topology requires an additional HV mask (e.g., a 40-volt PBL mask), and driver current source devices $M_{P2}$, $M_{P3}$, $M_{P4}$, $M_{P5}$ need to be rated for 40 volts VDS. Moreover, cascode device $M_{P4}$ sees a |VGS| violation (e.g., an absolute-value gate-source voltage of greater than 5 volts), when power FET gate node GATE_PASSFET is pulled low during current limiting operation to limit the current through the power FETs $M_{NP0}$, $M_{NP1}$. Cascode device $M_{P2}$ sees a similar |VGS| violation when power FET gate node GATE_SENSEFET is pulled low during reverse current protection to sense if VBUS is greater than PPHV during source mode and thus to turn off $M_{NP0}$.

Hence, when limited to using low-voltage devices for its cascode current sources, the gate drive topology 200 shown in FIG. 2 is suited only for driving internal power FETs having a gate-source voltage VGS of no greater than 5 volts and cannot be used for this application when the gate-source voltage VGS of the power FETs is expected to be, or has the potential to be, greater than 5 volts.

Figure 3:
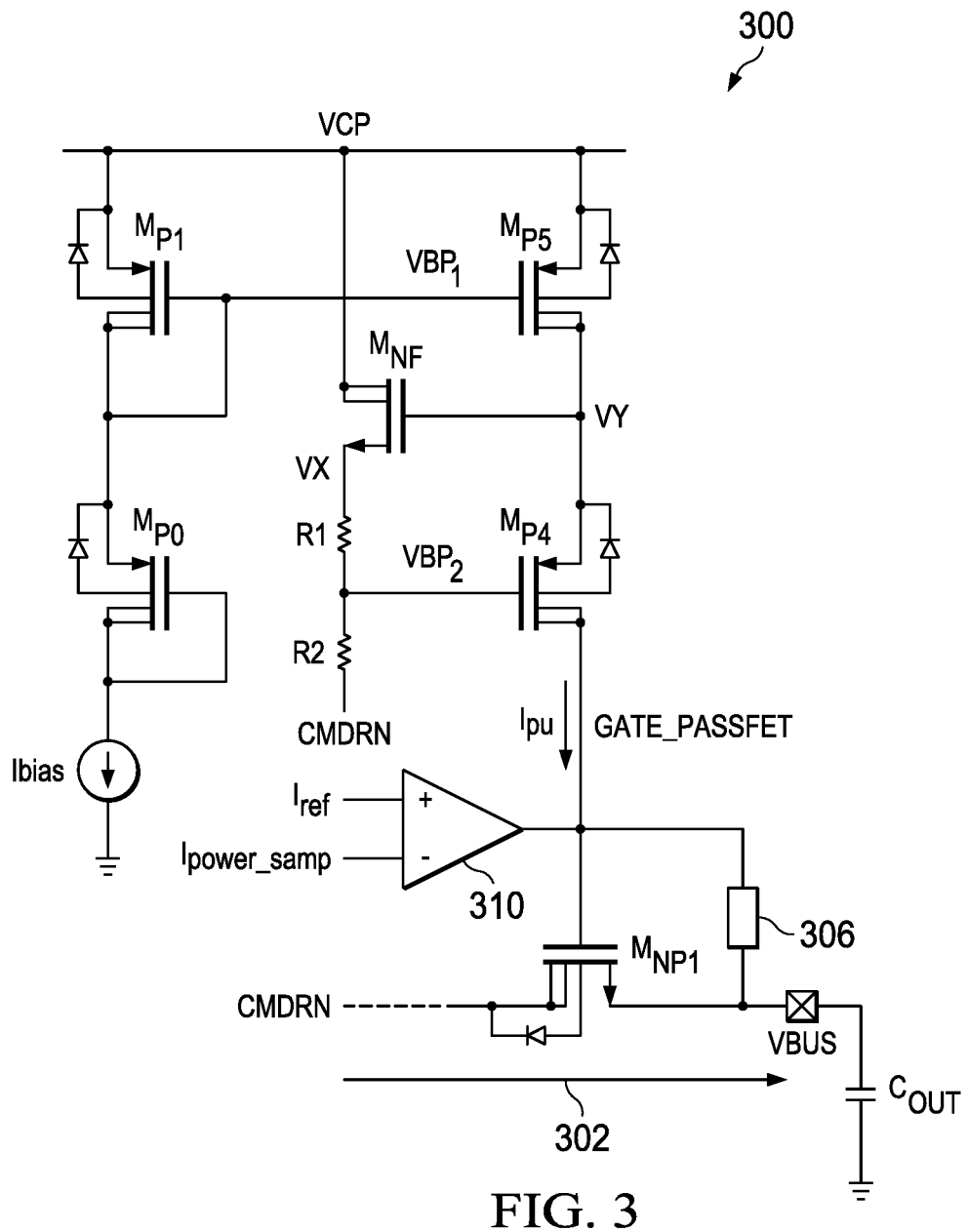
FIG. 3 is a circuit diagram of another example power supply circuit.

FIG. 3 shows a current source topology 300 used for a high voltage (HV) NexFET gate driver circuit in USB PD power paths. Topology 300 shares many features in common with topology 200 in FIG. 2, but differs in the design of its cascode gate driver, consisting of cascode transistors $M_{P4}$, $M_{P5}$, feedback transistor $M_{NF}$, and divider resistors R1, R2 at the top of the diagram. For clarity of illustration, only the current source drive for GATE_PASSFET ($M_{MP1}$) is shown, while the current source drive for GATE_SENSEFET is omitted. The same cascode gate driver in topology 300 can be used for driving the gate of $M_{NP0}$ as well (not shown). As examples, $M_{P4}$, $M_{P5}$ can be 30-volt VDS rated DEPMOS devices, with a minimum drain-to-source breakdown voltage ($BV_{DSS}$) rating of 35 volts. These ratings are a function of the processes used to fabricate the FET devices. The illustrated topology 300 avoids the need for a 40-volt HV mask.

Feedback transistor $M_{NF}$ and the voltage divider formed by resistances R1 and R2 form a cascode protection circuit that can correspond to cascode protection circuit 122 in FIG. 1. As illustrated in FIG. 3, the cascode protection circuit samples the voltage at cascode node VY and adaptively varies the voltage to the gate of the lower stage of the cascode, i.e., at divider node $VBP_2$, such that the gate-source voltage of the cascode's lower-stage device $M_{P4}$ is always protected from |VGS| violations. Furthermore, when the drain of the cascode's lower stage device, i.e., the node labeled GATE_PASSFET, is pulled low, e.g., by a current limit circuit, as may happen during an overcurrent condition requiring the limiting of current through the power path to/from VBUS, the cascode protection circuit automatically configures lower-stage transistor $M_{P4}$ as a source follower and puts cascode lower-stage transistor $M_{P4}$ in saturation. The cascode protection circuit closes a feedback loop to ensure cascode node VY settles to a value of $VBP_2$ plus the VGS of $M_{P4}$.

As indicated by arrow 302, the power path circuit 300 can operate in source mode, i.e., to provide current flow from system-side high-voltage power path node PPHV (omitted in FIG. 3) to peripheral-side bus voltage node VBUS. Gate-to-source clamp circuit 306 maintains a constant gate-source potential difference VGS (i.e., a target VGS) for power FETs $M_{NP1}$ by taking in charging current $I_{pu}$ after the gate of power FET $M_{NP1}$ is charged.

Feedback transistor $M_{NF}$, and divider resistors R1, R2 can be designed such that topology 300 will never suffer the |VGS| violation problems inherent in topology 200, as follows. Feedback transistor $M_{NF}$ operates as a source follower. Feedback transistor $M_{NF}$ and a voltage divider consisting of feedback resistors R1 and R2 set the voltage at node VX and hence the voltage at node $VBP2$ based on the voltage at power FET gate node GATE_PASSFET, such that $M_{P4}$ and $M_{P5}$ always operate within the reliability limit of their gate-source voltage VGS (e.g., less than 5 volts) and drain-source voltage VDS (e.g., less than 30 volts).

Circuit 300 can have several modes of operation, including a "normal operation" mode, when power is being provided over the PPHV-VBUS power path below a threshold current limit, and a "current limiting operation" mode, when super-threshold current draw over the power path causes current limit circuit 310 (e.g., a current limit amplifier) to limit the current through power FET $M_{NP1}$ and thus through the PPHV-VBUS power path. The cascode gate driver circuit of topology 300 is capable of protecting devices $M_{P4}$, $M_{P5}$ automatically when transitioning between modes and ensuring no |VGS| violations.

During normal operation of topology 300, i.e., during operation to provide current below a predetermined threshold current such that an overcurrent condition is not triggered, current source transistor $M_{P5}$ operates in saturation and $M_{P4}$ operates in its linear region as the voltage at power FET gate node GATE_PASSFET at or near the full specified gate-source voltage VGS of the power FET $M_{NP1}$, (e.g., GATE_PASSFET=VBUS+10 volts). This is because, as demonstrated by the equations immediately below, (a) the charge pump voltage VCP is fully loaded and its minimum voltage is about VBUS+10.3 volts, and (b) GATE_PASSFET=VBUS+10 volts, leaving no headroom for $M_{P4}$ to be in saturation. $M_{P5}$ can be sized to have longer channel length for greater current mirror accuracy. For example, MP5 can be sized to have a channel length that is at least five times longer than the minimum channel length (i.e., $L_{MP5} > 5 * L_{min}$). In the equations below, threshold voltage $V_{THP}$ is the minimum gate-to-source voltage that causes a current to flow when a voltage is applied between the drain and the source of the MOSFET, $VSD_{MP4}$ is the source-drain voltage of transistor $M_{P4}$, $VGS_{MNF}$ is the gate-source voltage of transistor MNF, and the voltages of the other nodes are as labeled in FIG. 3.

Assume PPHV = 24 V, $|V_{THP}| \approx 1$ V, $$GATE_{PASSFET} = VBUS + 10 \text{ V}, \frac{R2}{R1+R2} = \frac{3}{4}$$

Assuming $VSD_{MP4} > 0.5$ V for saturation, then $VY = VBUS + 10.5$ V $$VX = VY - VGS_{MNF} \approx VY - 1 \text{ V}$$

$$VSD_{MP4} > VY - VBP_2 - V_{THP}$$

$$0.5 \text{ V} > VBUS + 10.5 \text{ V} - \left\{(VY - 1 \text{ V})\frac{R2}{R1+R2} + VBUS\frac{R1}{R1+R2}\right\} - V_{THP}$$

$$0.5 \text{ V} > 10.5 \text{ V} - \left\{(10.5 \text{ V} - 1 \text{ V})\frac{R2}{R1+R2}\right\} - 1 \text{ V}$$

$$0.5 \text{ V}! > 10.5 \text{ V} - \left\{(10.5 \text{ V} - 1 \text{ V})\frac{3}{4}\right\} - 1 \text{ V} = 2.375 \text{ V},$$

hence $M_{P4}$ is in linear region.

The above inequality is likewise not satisfied even if the saturation threshold is taken as 0.3 volts, since 0.3 volts is not greater than 2.375 volts, just as 0.5 volts is not greater than 2.375 volts, as in the above analysis.

Any increase in charge pump voltage VCP is limited by area and the process reliability specification, as it would increase the drain/source standoff voltage to substrate to greater than 35 volts and impact device reliability. For the case when the maximum bus voltage VBUS is 24 volts and the target power FET VGS as enforced by gate clamp 306 is 10 volts, then CMDRN is at 24 volts, GATE_PASSFET is at 34 volts, $VBP_2$ is at 30.75 volts, VX is at 33 volts, cascode node VY is at 34 volts, and $M_{P5}$ is operating in its saturation region while $M_{P4}$ is operating in its linear region.

During current limiting operation, the gate of the power FET, i.e., $M_{NP1}$ in the example illustrated in FIG. 3, is pulled low (e.g., to close to 1 volt, e.g., between 0.5 volts and 1.5 volts) by current limit circuit 310 to limit the current through power FET $M_{NP1}$. Consequently, the drain of lower-stage device $M_{P4}$ will also be pulled low, since such drain node is the same node as the gate of the power FET, i.e., GATE_PASSFET in the example illustrated in FIG. 3. Thus, there is a large voltage difference between the source of upper-stage device $M_{P5}$ and the drain of lower-stage device $M_{P4}$, resulting in a large VDS for $M_{P4}$, making it possible for $M_{P4}$ to enter into saturation. Thanks to the arrangement of circuit 300, when the drain-source voltage VDS of $M_{P4}$ increases, the cascode protection circuit automatically biases $M_{P4}$ and $M_{P5}$ in saturation, offering higher current accuracy during current limiting and presenting higher output impedance to the gate of power FET $M_{NP1}$ and the current limit circuit 310. $M_{P4}$ operates as a source follower and defines the voltage at cascode node VY as one lower-stage VGS above divider node $VBP_2$.

The current limit circuit 310 senses the drain-source voltage VDS of power FET $M_{NP1}$ and throttles GATE_PASSFET to limit current through the power FET $M_{NP1}$ when the current through the power FET goes above a predetermined current threshold $I_{ref}$. As an example, current limit circuit 310 can sample the current through the PPHV-VBUS power path, which power path current sample value is noted in FIG. 3 as $I_{power\_samp}$, and compare this sampled power path current value to threshold current value $I_{ref}$, the precise value of which can be programmable or selectable. When $I_{power\_samp}$ exceeds the $I_{ref}$ threshold, current limit circuit 310 begins pulling the voltage down on GATE_PASSFET.

During this current limiting operation, the cascode gate driver automatically presents higher impedance to the gate of power FET $M_{NP1}$ and current limit circuit 310, thereby improving the small signal stability of the current limit circuit 310. For the case when the maximum bus voltage VBUS is 24 volts, then CMDRN is at 24 volts, GATE_PASSFET is at 1 volt, cascode node VY is at 27 volts, VX is at about 26 volts, VCP is at 34.4 volts, and both $M_{P4}$ and $M_{P5}$ are operating in the saturation region. In such an example the $V_{GS}$ of feedback transistor $M_{NF}$ is approximately 1 volt (i.e., VX will be about 1 volt less than cascode node VY). That $M_{P4}$ operates in saturation region during current limiting operation is demonstrated as follows:

$$VGS_{MNF} \approx 1 \text{ V}$$

$$VY \approx |VGS_{MP4}| + VBP_2$$

$$VY \approx |VGS_{MP4}| + \left\{(VY - VGS_{MNF})\frac{R2}{R1+R2} + VBUS + \frac{R1}{R1+R2}\right\}$$

$$VY \approx |VGS_{MP4}| + \left\{(VY - 1 \text{ V})\frac{R2}{R1+R2} + VBUS\frac{R1}{R1+R2}\right\}$$

$$VY * \left\{1 - \frac{R2}{R1+R2}\right\} \approx |VGS_{MP4}| - (1 \text{ V}) * \frac{R2}{R1+R2} + VBUS\frac{R1}{R1+R2}$$

$$VY * \left\{1 - \frac{3}{4}\right\} \approx 1.5 \text{ V} - 1 \text{ V} * \frac{3}{4} + 24 \text{ V} * \frac{1}{4}$$

$$VY \approx 4 * (6 + 1.5 - 0.75) \text{ V}$$

$$VY \approx 27 \text{ V, hence } M_{P4} \text{ is in saturation.}$$

Feedback resistors R1 and R2, which can be, for example, Poly VSR resistors, can be chosen such that cascode devices $M_{P4}$, $M_{P5}$ have their |VGS| within their reliability limit (e.g., less than 5 volts). A "Poly VSR" resistor is a polysilicon resistor having a very high sheet resistance (VSR). A Poly VSR is a low-area resistor that can have higher temperature variations than other types of resistors. However, because the resistances are used in a ratio in circuit 300, any such absolute variations in resistance as a function of temperature have no material effect on circuit operation. R1 and R2 can be chosen such that the feedback ratio R2/(R1+R2) is sufficiently large to avoid |VGS| violations on $M_{P4}$ even when VBUS is 0 volts. For example, the feedback ratio can be greater than ⅝, e.g., ¾. As an example, R1 can be chosen to be 2.25 megaohms and R2 can be chosen to be 6.77 megaohms. The below analysis demonstrates the logic behind picking a sufficiently large feedback ratio, such as ¾. As can be seen from the analysis below, picking a feedback ratio that is too small, e.g., ½, can result in |VGS| violations for $M_{P4}$.

Pick R1 and R2 such that $|VGS_{MP4}| < 5$ V

Case 1: if $\frac{R2}{R1+R2} = \frac{1}{2}$, $$|VGS_{MP4}| = VY - VBP_2 =$$

$$VBUS + 10 \text{ V} - \left\{(VBUS + 10 \text{ V} - VGS_{MNF})\frac{R2}{R1+R2} + VBUS\frac{R1}{R1+R2}\right\}$$

$$VGS_{MNF} \approx 1 \text{ V}$$

$$|VGS_{MP4}| = VBUS + 10 \text{ V} - \left\{(VBUS + 9 \text{ V})\frac{R2}{R1+R2} + VBUS\frac{R1}{R1+R2}\right\}$$

-continued $$|VGS_{MP4}| = 10\text{ V} - 9\text{ V} * \frac{R2}{R1+R2} = 10\text{ V} - 4.5\text{ V} = 5.5\text{ V} > 5\text{ V}$$

$$\text{Case 2: if } \frac{R2}{R1+R2} = \frac{3}{4},$$

$$|VGS_{MP4}| = 10\text{ V} - 9\text{ V} * \frac{R2}{R1+R2} = 10\text{ V} - 6.75\text{ V} = 3.25\text{ V} < 5\text{ V}$$

The circuit 300 of FIG. 3 can be used when power FETs $M_{NP0}$, $M_{NP1}$ are fabricated on one IC using a high-power FET fabrication process (e.g., a NexFET process) and the various other FET components shown are fabricated on a separate controller IC using a lower-power fabrication process. For example, the circuit 300 of FIG. 3 offers a reliable gate drive circuit to drive NexFETs with higher gate-source voltage VGS (i.e., VGS ≥10 V) and overcomes the reliability limitations of the circuit of FIG. 2 while saving an extra high voltage process mask (e.g., a DWELL or PBL mask) and thereby reducing the cost of a USB PD IC. Feedback transistor $M_{NF}$ and resistors R1 and R2 automatically set VX and hence cascode bias $VBP_2$ based on the voltage at gate of power FETs (GATE_SENSEFET, GATE_PASSFET), such that $M_{P2}$, $M_{P3}$, $M_{P4}$, and $M_{P5}$ always operate in the process reliability limit of VGS (e.g., less than 5 volts) and VDS (e.g., less than 30 volts). The gate-source voltage VGS of $M_{P4}$ is protected during normal operation and $I_p$, behaves as a very good current source during current limit operation. The circuit 300 of FIG. 3 achieves a 40-volt power FET controller IC design using 30-volt VDS rated MOSFETs, making it less expensive to fabricate than if it were made using 40-volt processes.

Figure 4:
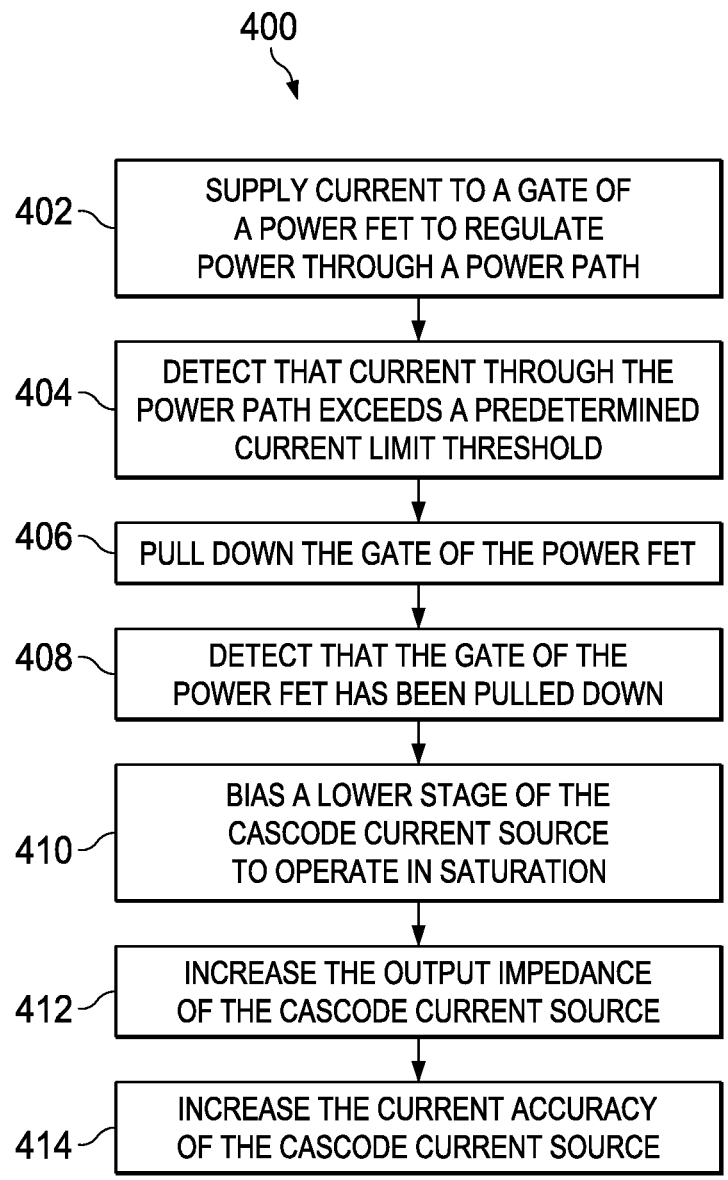
FIG. 4 is a flow chart illustrating an example method of regulating power in a power supply.

FIG. 4 is a flow chart illustrating an example method 400 of supplying (or regulating) power in a power supply. In the method 400, current can be supplied 402 to a gate of a power FET to regulate power through a power path having an output. This current can be supplied, for example, by a cascode current source. The method continues with detecting 404 that current through the power path exceeds a predetermined current limit threshold. Based on the detecting 404, the gate of the power FET can be pulled down 406, e.g., by a current limit circuit arranged to sample and compare current through the power path to a threshold. The method 400 continues with detecting 408 that the gate of the power FET has been pulled down, and the lower stage of the cascode current source is biased 410 to operate in saturation, thereby increasing 412 the output impedance of the cascode current source to the gate of the power FET and increasing 414 the current accuracy of the cascode current source.

The biasing can be done, for example, by a cascode protection circuit, which can include, e.g., a feedback transistor and a feedback voltage divider connected to the cascode current source. The reduction 406 the voltage of the gate of the power FET can be based on a sampled value of current through the power path exceeding a threshold current.

Upper and lower stages of the cascode current source can be 30-volt VDS rated DEPMOS devices with a minimum $BV_{DSS}$ rating of 35 volts. In some examples these are not rated for 40 volts VDS or greater. The voltage potential of the gate of the power FET can be at least 10 volts higher than the voltage potential of the output of the power path. A charge pump can supply voltage to the cascode current source higher than the voltage potential of a drain of the power FET. The minimum output of charge pump can be at least 10.3 volts more than the voltage potential of the power path output.

During current limiting operation the voltage potential of the gate of the power FET can be pulled down 406 to about 1 volt, e.g., between 0.5 and 1.5 volts. The detecting 408 that the gate of the power FET has been pulled down can involve sensing an increase of the VDS of the lower stage of the cascode current source by feeding back a signal between a source and a gate of the lower stage of the cascode current source. Such feedback signal can be setn through a feedback transistor and an upper resistance of a feedback voltage divider that can have an upper resistance R1 connected to the feedback transistor, a lower resistance R2 connected to a drain of the power FET, and the resistances can chosen such that a feedback ratio of R2/(R1+R2) is greater than ⅝, e.g., about ¾. As used with reference to the voltage divider resistances, the term "lower" is a designation of topological position and not an indication of relative resistance value.

Figure 5:
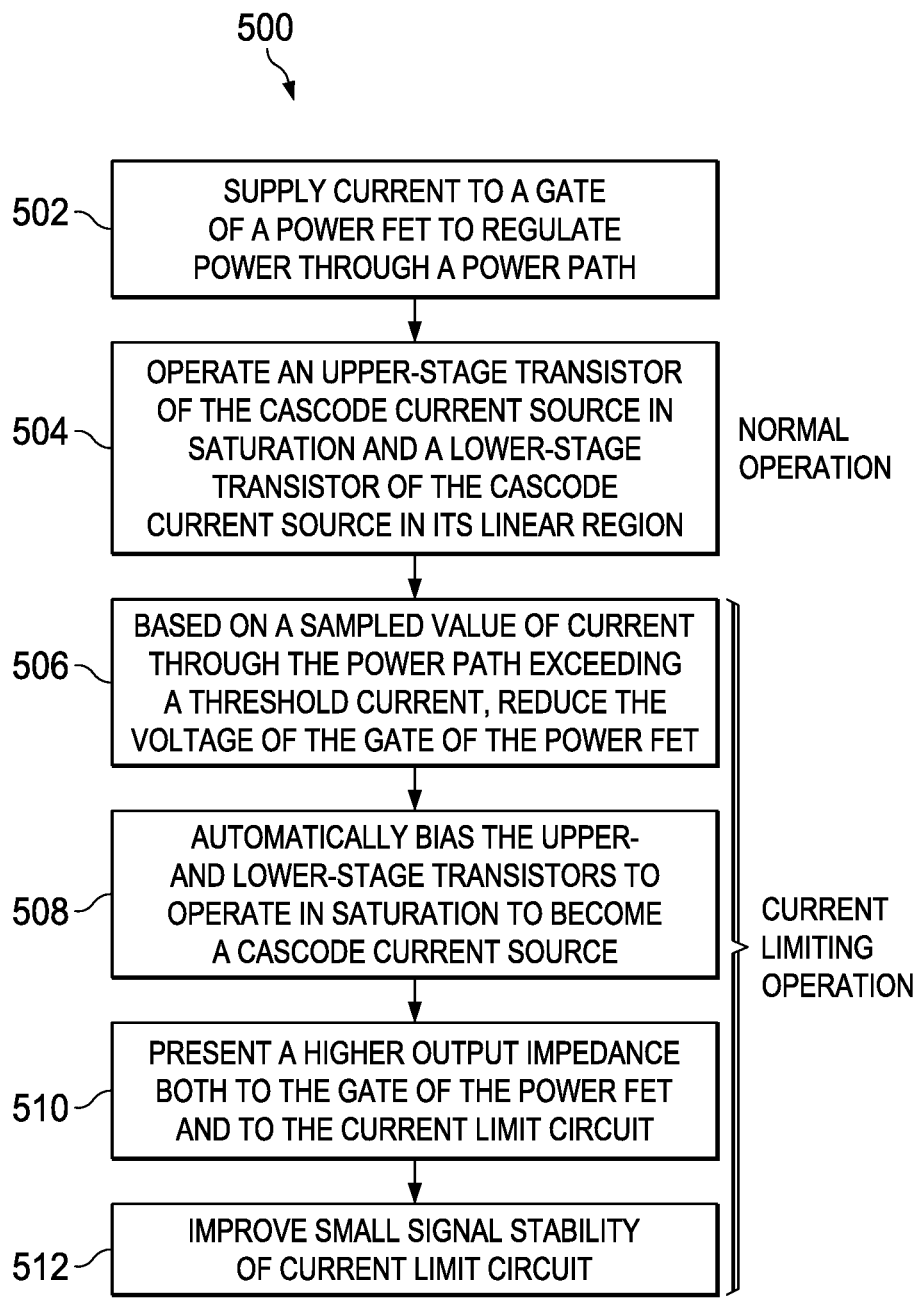
FIG. 5 is a flow chart illustrating an example method of regulating power in a power supply.

FIG. 5 is a flow chart illustrating an example method 500 of supplying (or regulating) power in a power supply. In the method 500, current is supplied 502 to a gate of a power FET to regulate power through a power path having an output. This current can be supplied, for example, by a cascode current source. During normal operation to provide current through the power path that is less than a predetermined current limit threshold, an upper-stage transistor of the cascode current source operates 504 in saturation and a lower-stage transistor of the cascode current source operates 504 in its linear region.

During current limiting operation to limit current through the power path to the predetermined current limit threshold, the gate of the power FET can be pulled low 506, e.g., by a current limit circuit arranged to sample and compare current through the power path to a threshold, and the upper-stage and lower-stage transistors is biased 508 to operate in saturation, thereby presenting 510 a higher output impedance both to the gate of the power FET and to the current limit circuit and improving 512 small signal stability of current limit circuit. The biasing can be done, for example, by a cascode protection circuit, which can include, e.g., a feedback transistor and a feedback voltage divider connected to the cascode current source. The reduction 506 the voltage of the gate of the power FET during current limiting operation can be based on a sampled value of current through the power path exceeding a threshold current.

In method 500, the upper- and lower-stage transistors of the cascode current source can be 30-volt VDS rated DEPMOS devices with a minimum $BV_{DSS}$ rating of 35 volts, but in some examples are not rated for 40 volts VDS or greater. The voltage potential of the gate of the power FET can be at least 10 volts higher than the voltage potential of the output of the power path. A charge pump can supply voltage to the cascode current source higher than the voltage potential of a drain of the power FET. The minimum output of charge pump can be at least 10.3 volts more than the voltage potential of the power path output.

In method 500, during normal operation the voltage potential of the gate of the power FET can be 34 volts or more. The voltage potential of the charge pump can be 34.3 volts or more. The voltage potential of the common drain can be about 24 volts, and the voltage potential of a middle node of the cascode current source connected to the drain of the upper-stage transistor and the source of the lower stage transistor can be about 34 volts. During current limiting operation the voltage potential of the gate of the power FET can be about 1 volt, e.g., between 0.5 and 1.5 volts, the voltage potential of the charge pump can be about 34.3 volts, the voltage potential of the common drain can be about 24 volts, and the voltage potential of a middle node of the cascode current source connected to the drain of the upper-stage transistor and the source of the lower stage transistor can be about 27 volts.

In method 500, the VDS of the lower-stage transistor of the cascode current source can increase during current limiting operation to bias the upper- and lower-stage transistors to operate in saturation. The feedback voltage divider can have an upper resistance R1 connected to the feedback transistor, a lower resistance R2 connected to a drain of the power FET, and the resistances can chosen such that a feedback ratio of R2/(R1+R2) is greater than 5/8, e.g., about ¾. As used with reference to the voltage divider resistances, the term "lower" is a designation of topological position and not an indication of relative resistance value.

Modifications are possible in the described embodiments, and other embodiments are possible, within the scope of the claims.

What is claimed is:

1. A power supply system comprising:
    a power field effect transistor (FET) having a gate and a drain, the drain being coupled between a power input and a power output;
    a voltage source;
    a cascode current source configured to provide a pull-up current from the voltage source to the gate of the power FET to regulate a supply of power between the power input and the power output, the cascode current source having upper and lower stages coupled at a cascode node between the upper and lower stages, and the lower stage having a gate; and
    a protection circuit including a feedback FET and first and second feedback resistors, in which a gate of the feedback FET is coupled to the cascode node, and in which the first and second feedback resistors are arranged as a voltage divider coupled between a source of the feedback FET and the drain of the power FET, the voltage divider having a dividing node between the first and second feedback resistors and coupled to the gate of the lower stage, the protection circuit being configured to sample the voltage at the cascode node, and in response, adaptively vary the voltage to the gate of the lower stage, and to configure the lower stage as a source follower and put the lower stage in a saturation region to limit current between the power input and the power output in response to an overcurrent condition.

2. The power supply system of claim 1, in which the protection circuit includes source follower circuitry and feedback voltage divider circuitry.

3. The power supply system of claim 1, in which the power FET is a NexFET on a different integrated circuit than the cascode current source and the protection circuit.

4. The power supply system of claim 1, in which the cascode current source and protection circuit contain no transistor rated for more than about 30 volts drain-to-source voltage.

5. The power supply system of claim 1, including a current limit circuit configured to compare, to a threshold current, current to the power output, and, in response to the current to the power output exceeding the threshold current indicating to the overcurrent condition, pulling lower the voltage of the gate of the power FET.

6. The power supply system of claim 1, in which a drain of the upper stage is connected to a source of the lower stage at the cascode node.

7. A method of supplying power, comprising:
    supplying current with a cascode current source from a voltage source to a gate of a power field effect transistor (FET) to regulate power through a power FET in a power path having an input and an output, the cascode current source having an upper stage and a lower stage;
    controlling a voltage at an input to the lower stage using a feedback FET coupled to a node between the upper and lower stages and coupled to a voltage divider that is coupled between a source of the feedback FET and the input of the power path; and
    detecting that current through the power path exceeds a current limit threshold, and, based on the detecting:
        pulling down a voltage at the gate of the power FET,
        detecting that the voltage at the gate of the power FET has been pulled down, and
        biasing from the voltage source to the drain of the power FET the lower stage of the cascode current source to operate in a saturation region, thereby increasing the output impedance of the cascode current source to the gate of the power FET.

8. The method of claim 7, in which the lower stage and an upper-stage of the cascode current source are drain-extended PMOS (DEPMOS) devices rated for no more than 30-volt drain-source voltage (VDS) with a minimum drain-to-source breakdown voltage (BVDSS) rating of no more than 35 volts.

9. The method of claim 7, in which the voltage of the gate of the power FET is at least 10 volts higher than the voltage of the output of the power path.

10. The method of claim 7, including supplying a voltage to the voltage source higher than the voltage of a drain of the power FET, and the minimum voltage output of charge pump is at least 10.3 volts more than the voltage of the power path output.

11. The method of claim 10, in which during normal operation the voltage of the gate of the power FET is 34 volts or more and the voltage potential of the charge pump is 34.3 volts or more.

12. The method of claim 10, in which, based on the detecting that current through the power path exceeds the current limit threshold, the voltage at the gate of the power FET is pulled down to between 0.5 volts and 1.5 volts.

13. The method of claim 7, in which the detecting that the voltage at the gate of the power FET has been pulled down includes sensing an increase of the drain-source voltage (VDS) of the lower stage of the cascode current source by feeding back a signal between a source and a gate of the lower stage of the cascode current source.

14. The method of claim 13, in which the feedback signal is fed through a feedback transistor and an upper resistance of a feedback voltage divider that comprises the upper resistance connected to the feedback transistor and a lower resistance connected to a drain of the power FET, and the resistances are chosen such that a feedback ratio of the lower resistance to the sum of the upper and lower resistances is greater than 5/9.

15. A Universal Serial Bus power deliver circuit comprising:
    a charge pump voltage terminal, a power path node, and a voltage bus node;
    a first power field effect transistor having a source coupled to the power path node, having a drain coupled to a common drain node, and having a gate;
    a second power field effect transistor having a source coupled to the voltage bus node, having a drain coupled to the common drain node, and having a gate;

a cascode current source including:
an upper transistor having a drain and source coupled between the charge pump voltage terminal and a cascode node, and having a gate;
a lower transistor having a source and drain coupled between the cascode node and the gate of the first power transistor, and having a gate; and
a protection circuit including:
a feedback transistor having a drain and source coupled between the charge pump voltage terminal and a feedback node, and having a gate connected to the cascode node; and
a voltage divider having one end coupled to the feedback node, having another end coupled to the common drain node, and having an intermediate node coupled to the gate of the lower transistor.

16. The Universal Serial Bus power deliver circuit of claim 15 in which the voltage divider includes a first resistor coupled between the one end and the intermediate node and a second resistor coupled between the intermediate node and the common drain node.

17. The Universal Serial Bus power deliver circuit of claim 15 in which the upper and lower transistors have a gate-source voltage reliability limit of 5 volts and have a drain-source voltage reliability limit of 30 volts.

18. The Universal Serial Bus power deliver circuit of claim 15 including:
another cascode current source including:
another upper transistor having a drain and source coupled between the charge pump voltage terminal and another cascode node, and having a gate;
another lower transistor having a source and drain coupled between the another cascode node and the gate of the second power transistor, and having a gate; and
another protection circuit including:
another feedback transistor having a drain and source coupled between the charge pump voltage terminal and another feedback node, and having a gate connected to the another cascode node; and
another voltage divider having one end coupled to the another feedback node, having another end coupled to the common drain node, and having another intermediate node coupled to the gate of the another lower transistor.

19. A circuit comprising:
a first field effect transistor (FET) having first and second terminals and a gate;
a gate drive circuit including:
a second FET having first and second terminals and a gate; and
a third FET having first and second terminals and a gate, the first terminal of the third FET coupled to the first terminal of the second FET, and the second terminal of the third FET coupled to the gate of the first FET; and
a feedback circuit including:
a fourth FET having first and second terminals and a gate, the first terminal of the fourth FET coupled to the second terminal of the second FET, and the gate of the fourth FET coupled to the first terminals of the second and third FETs;
a first resistor having first and second terminals, the first terminal of the first resistor coupled to the second terminal of the fourth FET, and the second terminal of the first resistor coupled to the gate of the third FET; and
a second resistor having first and second terminals, the first terminal of the second resistor coupled to the second terminal of the first resistor and to the gate of the third FET, and the second terminal of the second resistor coupled to the first terminal of the first FET.

20. A circuit comprising:
a first field effect transistor (FET) having first and second terminals and a gate;
a gate drive circuit including:
a second FET having first and second terminals and a gate; and
a third FET having first and second terminals and a gate, its the first terminal of the third FET coupled to the first terminal of the second FET, and the second terminal of the third FET coupled to the gate of the first FET;
a feedback circuit including:
a fourth FET having first and second terminals and a gate, the first terminal of the fourth FET coupled to the second terminal of the second FET, and the gate of the fourth FET coupled to the first terminals of the second and third FETs;
a first resistor having first and second terminals, the first terminal of the first resistor coupled to the second terminal of the fourth FET, and the second terminal of the first resistor coupled to the gate of the third FET; and
a second resistor having first and second terminals, the first terminal of the second resistor coupled to the second terminal of the first resistor and to the gate of the third FET, and the second terminal of the second resistor coupled to the first terminal of the first FET; and
a comparator circuit having a reference input and another input coupled to the first FET, and having an output coupled to the gate of the first FET.

21. A circuit comprising:
a first field effect transistor (FET) having first and second terminals and a gate;
a gate drive circuit including:
a second FET having first and second terminals and a gate; and
a third FET having first and second terminals and a gate, the first terminal of the third FET coupled to the first terminal of the second FET, and the second terminal of the third FET coupled to the gate of the first FET;
a feedback circuit including:
a fourth FET having first and second terminals and a gate, the first terminal of the fourth FET coupled to the second terminal of the second FET, and the gate of the fourth FET coupled to the first terminals of the second and third FETs;
a first resistor having first and second terminals, the first terminal of the first resistor coupled to the second terminal of the fourth FET, and the second terminal of the first resistor coupled to the gate of the third FET; and
a second resistor having first and second terminals, the first terminal of the second resistor coupled to the second terminal of the first resistor and to the gate of the third FET, the second terminal of the second resistor coupled to the first terminal of the first FET; and
a comparator circuit coupled to the first FET, and configured to compare a current in the first FET to a reference current and adjust a voltage at the gate of the first FET responsive to the comparison, and in which the feedback circuit is configured to bias the third transistor to operate in a saturation region responsive to the current exceeding the reference current and to bias the third transistor to operate in a linear region responsive to the current being less than the reference current.

* * * * *